(12) United States Patent
Lee et al.

(10) Patent No.: US 8,459,923 B2
(45) Date of Patent: Jun. 11, 2013

(54) APPARATUS FOR SUBSTRATE ALIGNMENT, APPARATUS FOR SUBSTRATE PROCESSING HAVING THE SAME, AND SUBSTRATE ALIGNMENT METHOD

(75) Inventors: Sang Don Lee, Yongin-Si (KR); Chi Wook Yu, Yongin-Si (KR)

(73) Assignee: Jusung Engineering Co., Ltd., Gyeonggi-Do (KR)

( * ) Notice: Subject to any disclaimer, the term of this patent is extended or adjusted under 35 U.S.C. 154(b) by 282 days.

(21) Appl. No.: 12/796,354

(22) Filed: Jun. 8, 2010

(65) Prior Publication Data

US 2010/0322754 A1 Dec. 23, 2010

(30) Foreign Application Priority Data

Jun. 23, 2009 (KR) .................. 10-2009-0056017

(51) Int. Cl.
*H01L 21/68* (2006.01)
(52) U.S. Cl.
USPC .................. 414/222.04; 414/749.6
(58) Field of Classification Search
USPC .............. 414/749.6, 222.04–222.06
See application file for complete search history.

(56) References Cited

U.S. PATENT DOCUMENTS

| | | | | |
|---|---|---|---|---|
| 3,284,884 A | * | 11/1966 | Prazak, III | 445/68 |
| 4,621,797 A | * | 11/1986 | Ziegenfuss | 269/34 |
| 4,628,986 A | * | 12/1986 | Southam | 164/159 |
| 4,784,377 A | * | 11/1988 | Woodward | 269/21 |
| 5,352,249 A | * | 10/1994 | Vollaro | 29/25.01 |
| 6,327,034 B1 | * | 12/2001 | Hoover et al. | 356/400 |
| 6,669,829 B2 | * | 12/2003 | Feltsman et al. | 204/298.11 |
| 7,049,549 B2 | * | 5/2006 | Nguyen et al. | 219/390 |
| 7,151,981 B2 | * | 12/2006 | Kurita et al. | 700/218 |
| 2009/0067954 A1 | * | 3/2009 | Lanee et al. | 414/172 |
| 2010/0122655 A1 | * | 5/2010 | Tiner et al. | 118/504 |

* cited by examiner

*Primary Examiner* — Saul Rodriguez
*Assistant Examiner* — Jonathan Snelting
(74) *Attorney, Agent, or Firm* — Andrew D. Fortney

(57) ABSTRACT

Disclosed are a substrate alignment apparatus precisely and automatically aligning a mask on a substrate by sequentially moving the substrate and the mask horizontally on a susceptor being driven up and down, a substrate processing apparatus including the same, and a substrate alignment method. The substrate alignment apparatus includes a position fixing unit protruding from an upper surface of the susceptor driven up and down in a chamber so as to form a reference line for alignment of the substrate and the mask, a horizontal transfer unit connected at outer surfaces of two sidewalls of the chamber and extended into the chamber to align the substrate and the mask according to the up and down movement of the susceptor until the substrate and the mask are stopped by the position fixing unit from horizontally moving, and a control unit adapted to control the susceptor and the horizontal transfer unit.

16 Claims, 7 Drawing Sheets

(a)

(Background Art)

(b)

(Background Art)

320 : 322, 324

APPARATUS FOR SUBSTRATE ALIGNMENT, APPARATUS FOR SUBSTRATE PROCESSING HAVING THE SAME, AND SUBSTRATE ALIGNMENT METHOD

CROSS-REFERENCE TO RELATED APPLICATION

This application claims priority to Korean Patent Application No. 10-2009-0056017 filed on Jun. 23, 2009 and all the benefits accruing therefrom under 35 U.S.C. §119, the contents of which are incorporated by reference in their entirety.

BACKGROUND

The present disclosure relates to an apparatus for substrate alignment, an apparatus for substrate processing having the same, and a substrate alignment method, and more particularly, to an apparatus for substrate alignment capable of precisely and automatically aligning a mask on a substrate by sequentially moving the substrate and the mask in a horizontal direction on a susceptor being driven up and down, an apparatus for substrate processing including the apparatus for substrate alignment, and a substrate alignment method.

Recently, a variety of flat panel display devices to replace a cathode ray tube are being developed and produced. A liquid crystal display (LCD), a field emission display (FED), an electroluminescent display (ELD), a plasma display panel (PDP), and so forth belong to the flat panel display.

Especially the ELD having a solid state property features a relatively wide range of use temperature, high impact-resistance and vibration-resistance, a wide viewing angle, and a fast response time. Therefore, the ELD is generally used as a high-performance flat panel display.

The ELD may be classified into an inorganic light emitting diode (ILED) and an organic LED (OLED) according to materials constituting an emitting layer. The OLED is widely used in recent days since it has superior luminance and response time to the ILED and is capable of color-display.

The OLED includes a first electrode layer constituted by a transparent insulation substrate and a predetermined pattern formed thereon, an organic emitting layer disposed on the first electrode layer, containing a luminescent material, and a second electrode layer disposed on the organic emitting layer. Usually, the first electrode layer serves as an anode electrode and the second electrode layer serves as a cathode electrode.

When the anode electrode is applied with a higher voltage than the cathode electrode, a hole moves from the first electrode layer to the organic emitting layer and an electron moves from the second electrode layer to the organic emitting layer. The moved hole and electron combine again at the organic layer, thereby forming an exciton. Energy from the exciton generates light having a specific wavelength.

For example, the organic emitting layer and the second electrode layer may be formed by vapor deposition as follows. A metal mask having a plurality of slits is prepared. The slits are arranged corresponding to a predetermined pattern to be formed on a substrate. In a vapor-deposition chamber, the material is evaporated through the slits and attached to a surface of the substrate.

The vapor deposition is performed as the mask is brought into close contact with the substrate or a predetermined patterned layer of the substrate. Therefore, it is very essential to dispose the substrate and the mask in their correct positions.

FIG. 1 schematically shows methods for aligning a substrate and a mask according to a related art.

Referring to FIG. 1A, first, substrate alignment pins 32 each having an inclined surface A are disposed on outer positions of an upper surface of a susceptor 30 provided in a chamber (not shown). A substrate 10 is slid down along the inclined surfaces A, thereby being seated on the susceptor 30.

The susceptor 30 is driven upward such that the mask alignment pins 32 disposed on the outer positions of the upper surface of the susceptor 30 are corresponded to alignment recesses 22 formed on outer positions of a lower surface of the mask 20.

However, the above related-art method merely using the fixed alignment pins 32 and 34 is available only when alignment margins are allowed. That is, the above method is inadequate when precise alignment between the substrate 10 and the mask 20 is required.

According to another related-art method, as shown in FIG. 1B, the mask 20 including a plurality of slits 24 for vapor-deposition of a predetermined pattern is moved on the substrate 10. During this, an optical microscope 40 or a camera checks whether an alignment mark 12 marked at the substrate 10 is aligned to an alignment hole 26 formed at the mask 20. When aligned, the substrate 10 and the mask 20 are brought into close contact with each other.

However, this method costs a lot of initial installation expenses because of expensive equipment such as the optical microscope 40. In addition, the substrate 10 and the mask 20 need to be in contact or almost in contact with each other for check of the aligned state using the optical microscope 40. Such a contact may damage the substrate 10 or the pattern formed on an upper surface of the substrate 10, accordingly increasing a defect rate of the substrate 10.

In a case where the substrate 10 and the mask 20 are found to be misaligned after the alignment process is completed, the substrate 10 and the mask 20 need to be separated, realigned, and rechecked by the optical microscope 40 and such processes may be repeated. As a result, the overall alignment time increases. Furthermore, since the alignment processes are discontinuously performed, it is hard to perform the alignment rapidly.

In addition, a tube 42 is installed on an optical path in the optical microscope 40 to more closely check the aligned state between the alignment mark 12 and the alignment hole 26. The tube 42 is easily contaminated or damaged by particles generated during processing of the substrate 10. In this case, the tube 42 needs repairing or replacing, consequently inducing additional expense and time.

SUMMARY

The present disclosure provides a substrate alignment apparatus capable of precisely and automatically aligning a substrate and a mask with each other during a chemical vapor deposition (CVD) for forming a thin film, by installing a plurality of position pins or position blocks on an upper surface of a susceptor adapted to align the substrate and the mask and by pushing the substrate and the mask by a horizontal transfer unit toward the position pins or the position blocks in association with an up-and-down movement of the susceptor, and also provides a substrate processing apparatus including the same and a substrate alignment method.

In accordance with an exemplary embodiment, a substrate alignment apparatus includes a position fixing unit connected to protrude from an upper surface of a susceptor which is driven up and down in an inner space of a chamber so as to form a reference line for alignment of a substrate and a mask; a horizontal transfer unit connected at outer surfaces of two not-opposing sidewalls of the chamber and extended through into the inner space and adapted to align the substrate and the mask in association with the up and down movement of the susceptor until a horizontal transfer of the substrate and the mask are stopped by the position fixing unit; and a control unit adapted to control driving of the susceptor and the horizontal transfer unit.

In accordance with another exemplary embodiment, a substrate alignment method includes: initially positioning a substrate and a mask in an inner space of a chamber; firstly raising a susceptor in the inner space such that the substrate is seated on an upper surface of the susceptor and horizontally pushing the substrate such that the substrate is aligned with a first reference line; secondly raising the susceptor such that an upper surface of the substrate is approximated to the mask and horizontally pushing the mask such that the mask is aligned with a second reference line; and thirdly raising the susceptor such that the substrate and the mask closely contact each other.

In accordance with yet another exemplary embodiment, a substrate processing apparatus includes a substrate alignment apparatus including a chamber having an inner space, a susceptor driven up and down in the inner space to seat a substrate and a mask sequentially thereon, a position fixing unit protruding from an upper surface of the susceptor to form a reference line for alignment of the substrate and the mask, and a horizontal transfer unit connected at the outer surfaces of the not-opposing sidewalls of the chamber and extended through into the inner surface so as to push the substrate and the mask in association with the up and down movement of the susceptor until a horizontal transfer of the substrate and the mask is stopped by the position fixing unit, and a fuel supply apparatus adapted to supply fuel into the inner space of the chamber.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
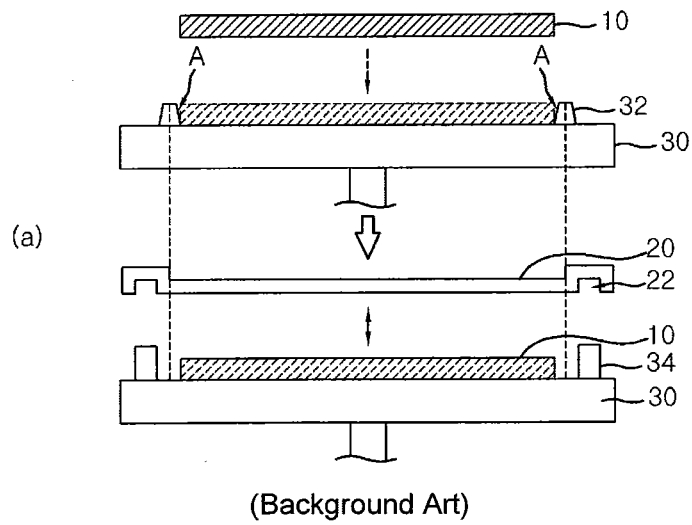
FIGS. 1A and 1B are schematic views illustrating methods for aligning a substrate and a mask according to a related art.
Figure 1:
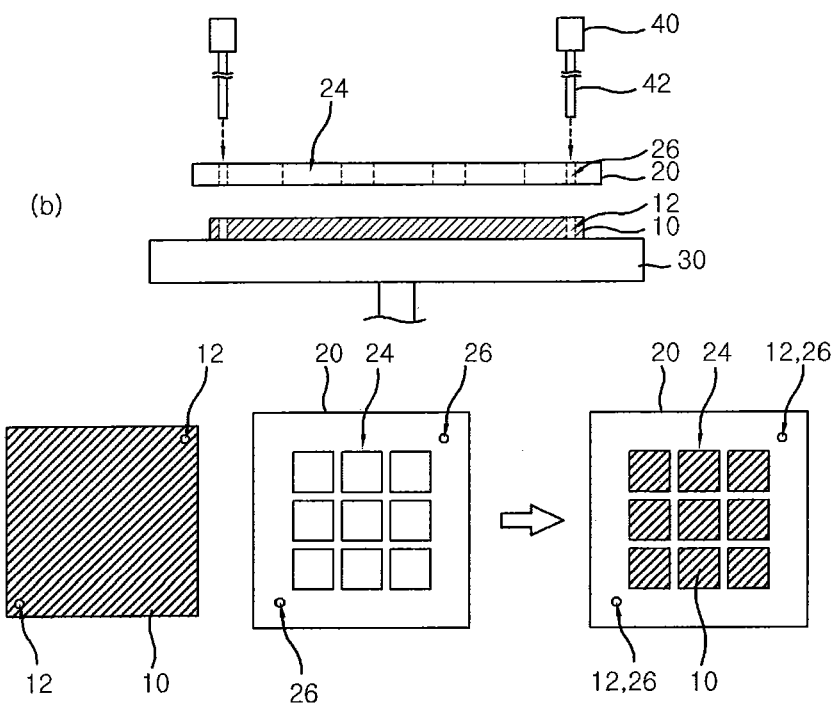

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, like reference numerals refer to like elements throughout.

Figure 2:
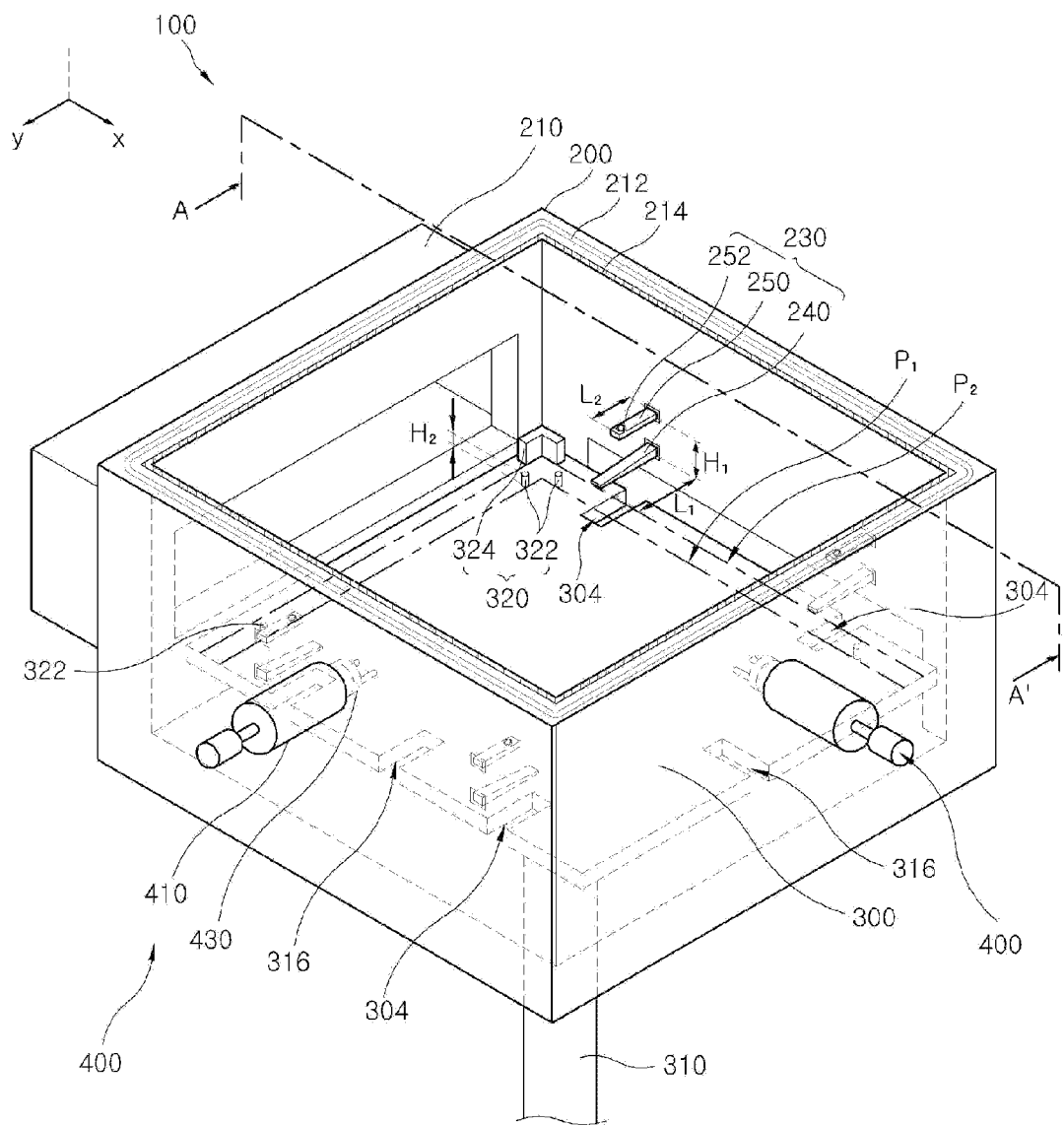
FIG. 2 is a perspective view showing an inside of a substrate alignment apparatus in accordance with an exemplary embodiment.
Figure 3:
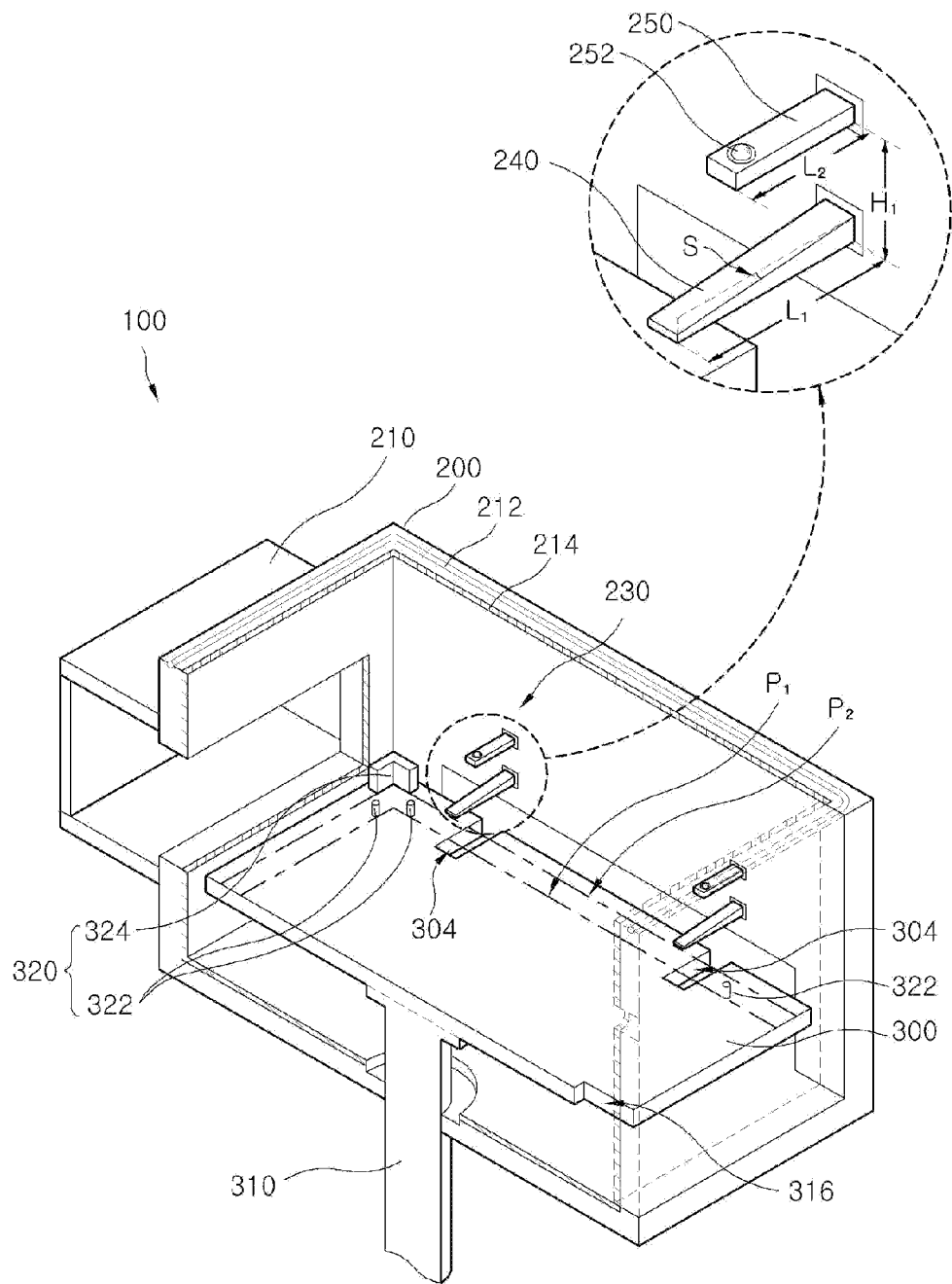
FIG. 3 is a sectional perspective view cut along a line A-A' of FIG. 2 to show the inner structure of the substrate alignment apparatus.
Figure 4:
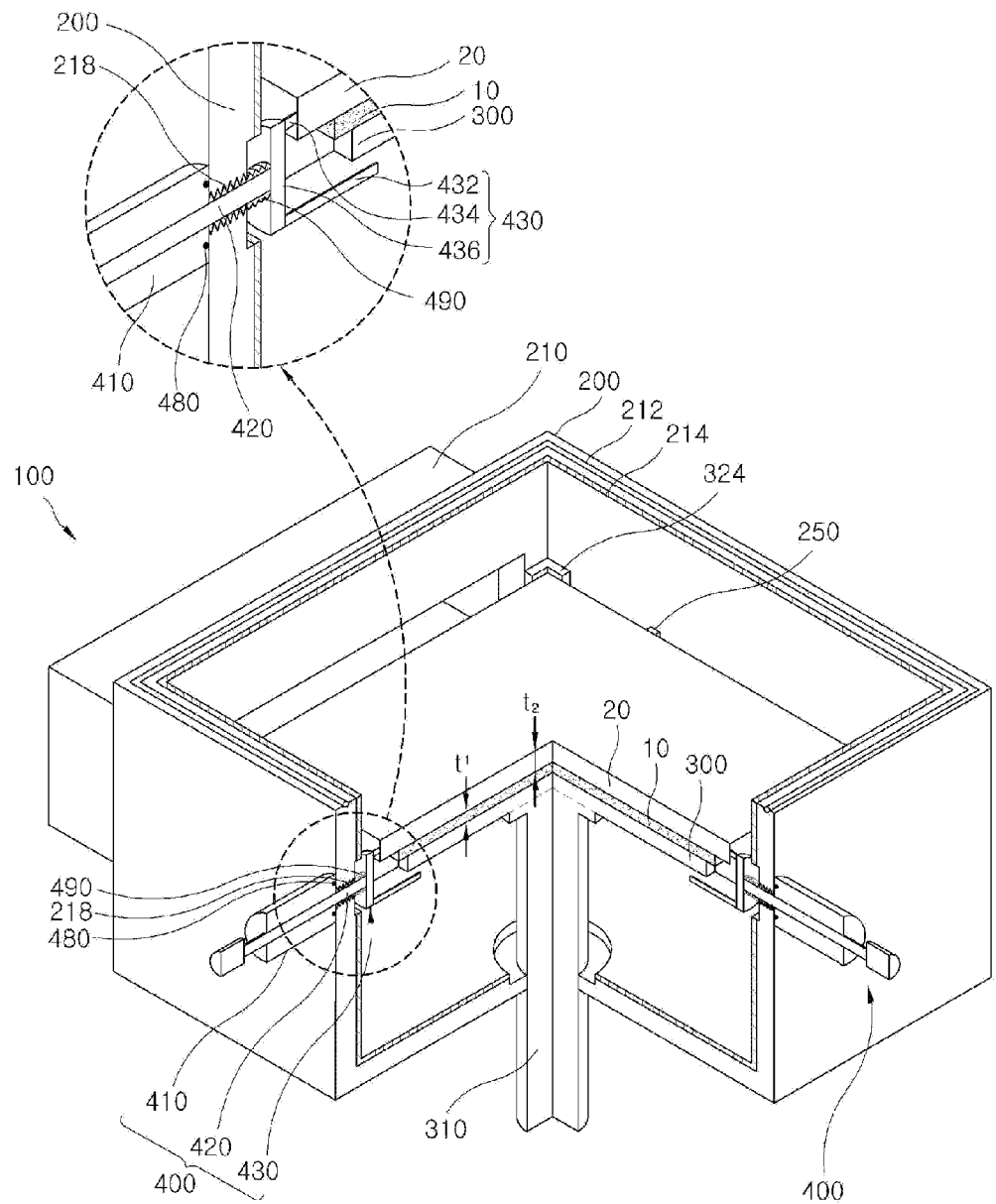
FIG. 4 is a view showing the inner structure of the substrate alignment apparatus of FIG. 2 by cutting away one corner of the substrate alignment apparatus.
Figure 5:
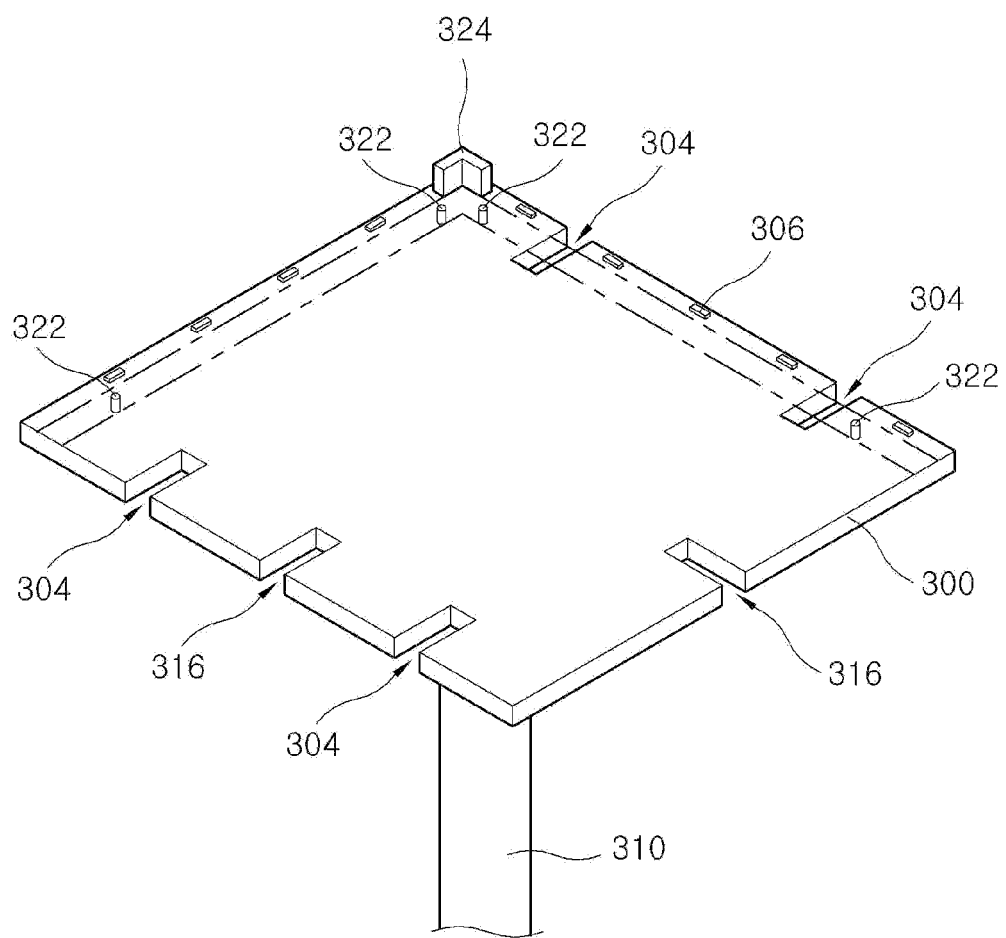
FIG. 5 is a perspective view of a susceptor shown in FIG. 2.

FIG. 2 is a perspective view showing an inside of a substrate alignment apparatus according to an embodiment. FIG. 3 shows the inner structure of the substrate alignment apparatus, being cut along a line A-A' of FIG. 2. FIG. 4 shows the inner structure of the substrate alignment apparatus of FIG. 2 by cutting away one corner of the substrate alignment apparatus. FIG. 5 is a perspective view of a susceptor shown in FIG. 2.

Referring to FIGS. 2 through 5, a substrate alignment apparatus 100 according to the embodiment includes a position fixing unit 320, a horizontal transfer unit 400, and a control unit (not shown). The position fixing unit 320 is connected to protrude from an upper surface of a susceptor 300 driven up and down in a chamber 200 which includes an inner space. The position fixing unit 320 provides reference lines $P_1$ and $P_2$ for alignment of a substrate 10 and a mask 20. The horizontal transfer unit 400 is connected at outer surfaces of two not-opposing sidewalls of the chamber 200 and extended through into the inner surface. In association with the up and down movement of the susceptor 300, the horizontal transfer units 400 sequentially push the substrate 10 and the mask 20 until a horizontal transfer of the substrate 10 and the mask 20 is stopped by the position fixing unit 320 on the susceptor 300, thus aligning the substrate 10 and the mask 20. The control unit (not shown) controls the operation of the susceptor 300 and the horizontal transfer units 400.

The substrate 10 may be any one of a semiconductor substrate made of silicon (Si), germanium (Ge), and the like, an insulation substrate made of glass, plastic, and the like, and a conductive substrate made of metal. In the present embodiment, glass having a high transparency is used for the substrate 10 for manufacturing an organic light emitting diode (OLED).

The chamber 200 has a hollow cylinder shape or a rectangular box shape and includes a predetermined inner space to process the substrate 10 therein. The shape of the chamber 200 is not specifically limited but may be varied according to a shape of the substrate 10. For example, the chamber 200 of the present embodiment has a rectangular box shape since the substrate 10 has a rectangular shape. A gate 210 is formed on one sidewall of the chamber 200 for entry and exit of the substrate 10 and the mask 20. An air discharge part 222 (FIG. 7) is formed on a lower wall of the chamber 200 to make a vacuum and discharge inner air.

Although the chamber 200 is explained above to have an integral body, the chamber 200 may be divided into a lower chamber having an open upper part and a chamber lid covering the upper part of the lower chamber as in the present embodiment. In this case, the chamber 200 further includes an O-ring 212 as a sealing member to seal a connection between the chamber lid and the lower chamber.

A thin protection plate 214 is attached to an inner wall of the chamber 200 to protect the inner wall from oxidation and corrosion by chemical reactions during processing of the substrate 10. For this purpose, the protection plate 214 is made of an anodized aluminum (Al). The protection plate 214 may be omitted when an anodizing coating is directly applied to the inner wall of the chamber 200.

The chamber 200 additionally includes a plurality of holders 230 protruding to the inner space. The holders 230 are mounted on two opposite inner sidewalls of the chamber 200, which are facing in a y-axis direction perpendicular to an x-axis direction in which the substrate 10 and the mask 20 are introduced to the inner space. The holders 230 support lower surfaces of the substrate 10 and the mask 20 and bring the substrate 10 and the mask 20 to their initial positions in the inner space. In other words, the holders 230 support the substrate 10 and the mask 20 until the substrate 10 and the mask 20 are sequentially seated and aligned on the susceptor 300.

The plurality of holders 230 include a plurality of substrate holders 240 adapted to support both sides of the lower surface of the substrate 10, and a plurality of mask holders 250 separated upward from the substrate holders 240 and adapted to support both sides of the lower surface of the mask 20. For stable support of the substrate 10 and the mask 20, the substrate holders 240 and the mask holders 250 have a bar shape, of which a part for contact with the lower surfaces of the substrate 10 and the mask 20 is horizontal to the ground. A distance $H_1$ between the substrate holders 240 and the mask holders 250 will be explained in detail with regard to the horizontal transfer unit 400.

The substrate holders 240 are mounted at uniform heights in the inner space of the chamber 200 so that the substrate 10 introduced in the inner space is initially positioned horizontally to the ground. Also, the mask holders 250 are mounted at uniform heights in the inner space so that the mask 20 is initially positioned horizontally to the ground.

According to the present embodiment, a pair of the substrate holders 240 and a pair of the mask holders 250 are mounted on each of the opposite inner sidewalls of the chamber 200. That is, the substrate 10 and the mask 20 are supported at four positions, respectively. Although the number of the holders 240 and 250 is not limited, increase of the number may complicate the inner structure. Also, four positions supporting the lower surfaces of the substrate 10 and the mask 20 are sufficient to stably bring the substrate 10 and the mask 20 to their initial positions.

An upper surface of each substrate holder 240, which contacts the lower surface of the substrate 10, has an inclination S inclined downward to the inner space. The inclination S is adapted to prevent tilting of the substrate 10 being introduced to the chamber 200. Additionally, the inclination S prevents the substrate 10 from sliding out of the substrate holder 240 and deviating from the initial position.

The plurality of mask holders 250 separated upward from the respective substrate holders 240 have a length $L_2$ smaller than a length $L_1$ of the substrate holders 240 because the mask 20 is larger than the substrate 10. A ball bearing 252 capable of freely rolling is connected at and exposed through one side of the upper surface of the mask holder 250. The ball bearing 252 makes a point-contact with a transfer guide recess (not shown) depressed from the lower surface of the mask 20. Accordingly, when the mask 20 is aligned on the mask holder 250 separated from the substrate 10, the mask 20 may be smoothly transferred with less friction. Also, damage of the substrate 10 and the pattern formed on the upper surface of the substrate 10 may be minimized Here, the substrate holders 240 and the mask holders 250 may be made of anodized Al to cope with chemical reactions performed in the inner space of the chamber 200.

The susceptor 300 includes a susceptor shaft 310 mounted through the lower wall of the chamber 200 and driven into and out of the inner space in an up and down direction, and a plate perpendicularly supported by the susceptor shaft 310. Hereinafter, the susceptor 300 refers to the plate thereof. The position fixing unit 320 is formed on the upper surface of the susceptor 300 and provides the reference lines $P_1$ and $P_2$ for alignment of the substrate 10 and the mask 20. In addition, a plurality of holder passing holes 304 are formed at an outer circumference of the plate of the susceptor 300 to allow passage of the holders 230. A push pin unit 430 is formed at the horizontal transfer units 400 to push lateral sides of the substrate 10 and the mask 20. Correspondingly, a horizontal transfer unit passing hole 316 is formed on two adjoining circumferential sides of the susceptor 300, which are adjacent to the horizontal transfer units 400 connected at the not-opposing sidewalls of the chamber 200. The horizontal transfer unit passing holes 316 allow the push pin units 430 to be horizontally inserted therein and to move without interference with the up and down movement of the susceptor 300.

If the position fixing unit 320 is broken by accident, the substrate 10 or the mask 20 pushed by the horizontal transfer units 400 may fail to be aligned according to the reference lines $P_1$ and $P_2$. To prevent this, a plurality of stoppers 306 (FIG. 5) made of ceramic may be arranged at intervals on the upper surface adjacent to a circumference of the susceptor 300.

The position fixing unit 320 includes a first position fixing unit 322 protruding from the upper surface of the susceptor 300 to stop a horizontal transfer of the substrate 10, and a second position fixing unit 324 more protruding than the first position fixing unit 322 from the upper surface of the susceptor 300 to stop a horizontal transfer of the mask 20. A protruding height $H_2$ of the first position fixing unit 322 is equal to or less than a thickness $t_1$ of the substrate 10. A protruding height $H_3$ of the second position fixing unit 324 is greater than the thickness $t_1$ of the substrate 10, and less than the combined thickness $t_1$ and a thickness $t_2$ of the mask 20. Therefore, an upper end of the first position fixing unit 322 does not protrude over the substrate 10 when the mask 20 is aligned with the upper surface of the substrate 10. Accordingly, the substrate 10 and the mask 20 are efficiently brought into close contact with each other.

The first and the second position fixing units 322 and 324 may be a plurality of position pins protruding from the upper surface of the susceptor 300 at intervals along two adjoining circumferential sides of the susceptor 300, which are not adjacent to the horizontal transfer units 400. Alternatively, the first and the second position fixing units 322 and 324 may be a plurality position blocks connected to protrude near a corner formed by the two adjoining circumferential sides of the susceptor 300, which are not adjacent to the horizontal transfer units 400.

According to the embodiment, a pair of position pins having a cylindrical shape are disposed on the upper surface of the susceptor 300 along each of the two adjoining circumferential sides such that totally four position pins are mounted on the susceptor 300. As the substrate 10 or the mask 20 is horizontally transferred by the horizontal transfer units 400 mounted in intersecting directions, two position pins are brought into contact with each lateral side of the substrate 10 or the mask 20. As a consequence, the substrate 10 or the mask 20 is supported by four position pins with two lateral sides thereof and immovably fixed in a final alignment position. In the final alignment position, two adjoining lateral sides of the substrate 10 or the mask 20 are disposed on the reference lines $P_1$ and $P_2$ formed by the position fixing units 320. The first position fixing unit 322 forms a first reference line $P_1$ and the second position fixing unit 324 forms a second reference line $P_2$ on the susceptor 300.

On the other hand, the position block has an integral body equivalent to the plurality of position pins. The position block has an L-shape cross section for contact with a corner of the substrate 10 or the mask 20. Whereas the position pins make a line-contact with the side of the substrate 10 or the mask 20, the position block makes a surface-contact with the two adjoining lateral sides of the substrate 10 or the mask 20, thereby achieving the same position fixing effect as the position pins. When the substrate 10 or the mask 20 is not movable any more, the substrate 10 or the mask 20 is determined to be in the final alignment position where the two adjoining lateral sides of the substrate 10 or the mask 20 are disposed on the reference lines $P_1$ and $P_2$ formed by the position fixing units 320.

In the present embodiment, a plurality of the position pins and one position block are formed on the susceptor 300 to align the substrate 10 and the mask 20, respectively. However, not limited to the embodiment, the substrate 10 may be aligned by the position block and the mask 20 may be aligned by a plurality of the position pins.

Figure 6:
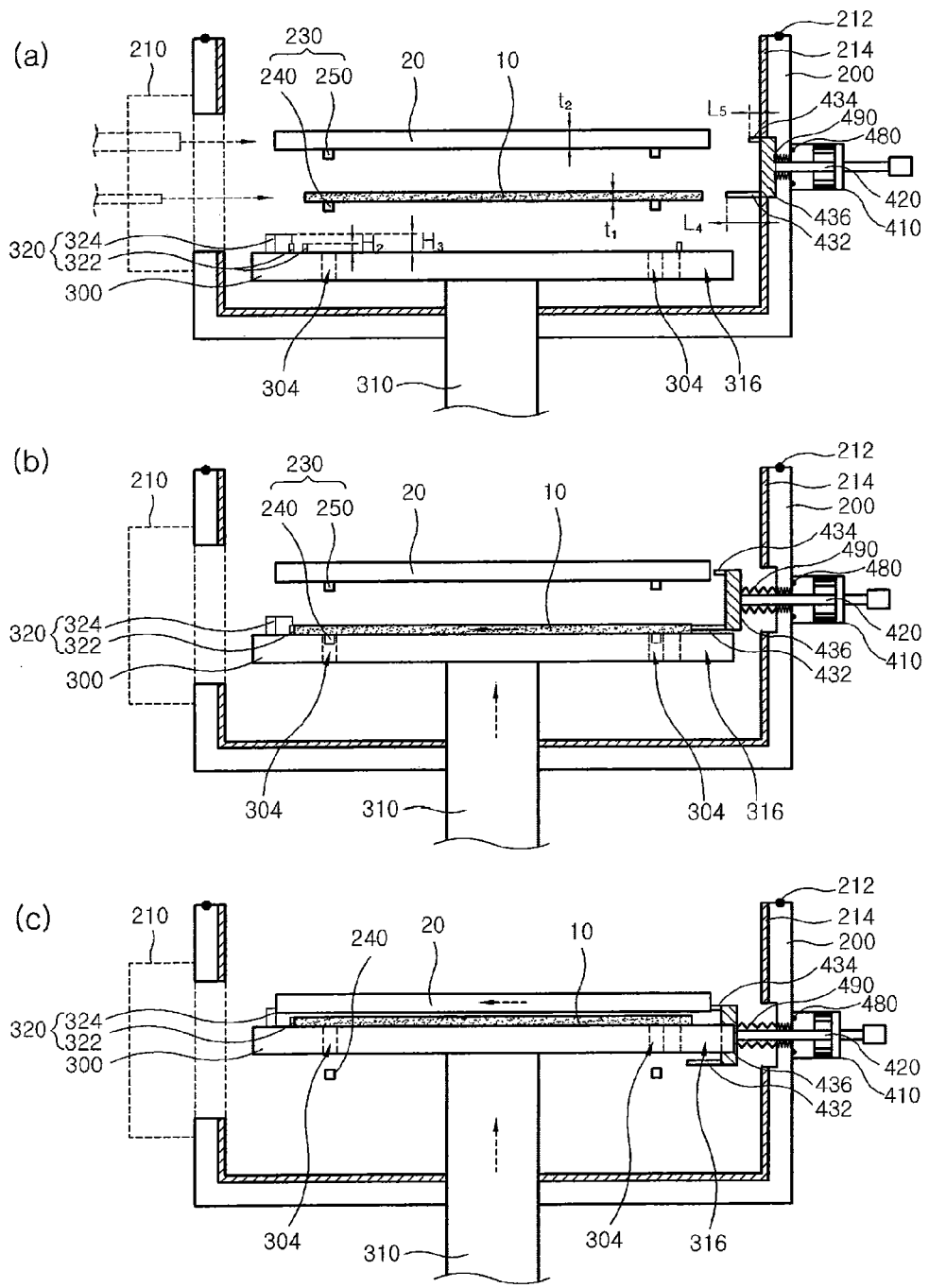
FIGS. 6A through 6C show sequential operational states of the substrate alignment apparatus according to a substrate alignment method in accordance with an exemplary embodiment.

The horizontal transfer units 400 are multi-stage driving units driven in a horizontal direction in association with the up and down movement of the susceptor 300. The horizontal transfer units 400 are provided in a pair and connected to the outer surfaces of the two not-opposing sidewalls of the chamber 200, respectively. Each of the horizontal transfer units 400 include a cylinder 410 including a piston 420 reciprocated in a horizontal direction through the sidewall of the chamber 200, and the push pin unit 430 connected to one end of the piston 420 to push the lateral side of the substrate 10 or the mask 20 according to the horizontal movement of the piston 420. Here, the multi-stage structure means that the substrate 10 and the mask 20 are horizontally transferred and aligned at different heights by the horizontal transfer units 400 as shown in FIG. 6.

The cylinder 410 allows the piston 420 to freely reciprocate therein while controlling a driven distance of the piston 420. An electromotive cylinder, a pneumatic cylinder, a hydraulic cylinder and the like may be used for the cylinder 410. In the present embodiment, an air cylinder of the pneumatic system is used due to its low installation cost and easy maintenance.

A cylinder connector 218 including a screw groove is formed on the sidewall of the chamber 200 to which the cylinder 410 is mounted. The cylinder 410 includes a screw thread on an outer circumference thereof corresponding to the cylinder connector 218 so as to easily form an airtight connection with the chamber 200. In addition, an O-ring 480 may be interposed between the outer surface of the sidewall of the chamber 200 and the cylinder 410 to increase the airtightness of the horizontal transfer unit 400. A bellows tube 490 is formed around the piston 420 exposed between the push pin unit 430 and an inner surface of the sidewall of the chamber 200. The bellows tube 490 having a flexible body protects the piston 420 as extending and contracting according to the horizontal movement of the piston 420.

Although not shown, the cylinder 410 is equipped with a speed controller to adjust a driven speed of the piston 420.

The push pin unit 430 connected to the one end of the piston 420 and horizontally moved within the inner space of the chamber 200 includes a substrate push pin 432 pushing the lateral side of the substrate 10, a mask push pin 434 pushing the lateral side of the mask 20, and a push pin fixing body 436 spacing out the substrate push pin 432 and the mask push pin 434 from each other linearly in a vertical direction and fixing the substrate push pin 432 and the mask push pin 434 in their horizontal positions. Specifically, the mask push pin 434 is connected at an upper part of one side of the push pin fixing body 436 and the substrate push pin 432 is disposed right under the mask push pin 434. The piston 420 is connected to the other side of the push pin fixing body 436. According to the above structure, as the piston 420 horizontally moves, the substrate push pin 432 and the mask push pin 434 are horizontally moved together. Since the mask 20 aligned on the substrate 10 is larger than the substrate 10, a horizontal length $L_4$ of the substrate push pin 432 is formed greater than a horizontal length $L_5$ of the mask push pin 434.

Hereinafter, a method for precisely aligning the mask on the substrate using the substrate alignment apparatus according to the embodiment will be explained.

FIG. 6 is a view showing sequential operational states of the substrate alignment apparatus to explain the substrate alignment method according to an exemplary embodiment.

Referring to FIG. 6A, the substrate 10 and the mask 20 are introduced in the inner space of the chamber 20 by a transfer robot (not shown) provided at the outside of the chamber 200. Next, the substrate 10 and the mask 20 are put on the substrate holders 240 and the mask holders 250 protruding from the inner sidewall of the chamber 200 and brought to the initial position to wait until the alignment.

As shown in FIG. 6B, next, the susceptor 300 is first raised to seat the substrate 10 on the upper surface thereof. The cylinder 410 of the horizontal transfer unit 400 connected to the sidewall of the chamber 200 is driven. Therefore, the substrate push pin 432 pushes the lateral side of the substrate 10 such that the two adjoining lateral sides of the substrate 10 closely contact the first position fixing unit 322, that is, the position pins, protruding on the upper surface of the susceptor 300. In the present embodiment, the plurality of position pins are used as the first position fixing unit 322 and the position blocks as the second position fixing unit 324.

The substrate push pin 432 may contact the lateral side of the substrate 10 as the piston 420 of the cylinder 410 horizontally moves to the substrate 10. However, since the length $L_4$ of the substrate push pin 432 is greater than the length $L_5$ of the mask push pin 434, the mask push pin 434 does not contact the lateral side of the mask 20. Thus, according to the operations of the susceptor 300 and the horizontal transfer unit 400, the substrate 10 may be precisely disposed and aligned with a reference position defined on the susceptor 300. When the substrate 10 is not pushed any more, the piston 420 of the cylinder 410 returns to its initial position where the push pin unit 430 is adjacent to the inner sidewall of the chamber 200.

As shown in FIG. 6C, the susceptor 300 is secondly raised with the substrate 10 seated on the upper surface thereof until the upper surface of the substrate 10 is approximated to the mask 20. As the cylinder 410 of the horizontal transfer unit 400 connected to the sidewall of the chamber 200 is horizontally driven, the mask push pin 434 pushes the lateral side of the mask 20 such that one corner of the mask 20 contacts the second position fixing unit 324, that is, the position block, formed at the upper surface of the susceptor 300. While the mask push pin 434 is horizontally moving the mask 20, the push pin fixing body 436 enters the horizontal transfer unit passing hole 316 formed at the susceptor 300. The substrate push pin 432 vertically separated by the length H1 from the mask push pin 434 moves horizontally under the susceptor 300. Therefore, the mask push pin 434 is able to push the mask 20 smoothly. When the mask 20 is not moved any more, the piston 420 of the cylinder 410 returns to its initial position with is adjacent to the inner sidewall of the chamber 200. After the substrate 10 and the mask 20 are aligned on the susceptor 300 through the above processes, the susceptor 300 is thirdly raised to bring the substrate 10 and the mask 20 into close contact with each other.

As described above, the mask 20 may be automatically aligned on the substrate 10 quickly and precisely by the substrate alignment method according to the embodiment.

Hereinafter, a substrate processing apparatus equipped with the above-described substrate alignment apparatus will be described. In the following, the elements of the substrate alignment apparatus already explained above will not be described again.

Although the substrate alignment apparatus according to the embodiment may be applied to various chemical vapor deposition (CVD) apparatuses, the substrate alignment apparatus will be explained as applied to a plasma enhanced CVD (PECVD) apparatus which forms a passivation layer to manufacture an OLED.

Figure 7:
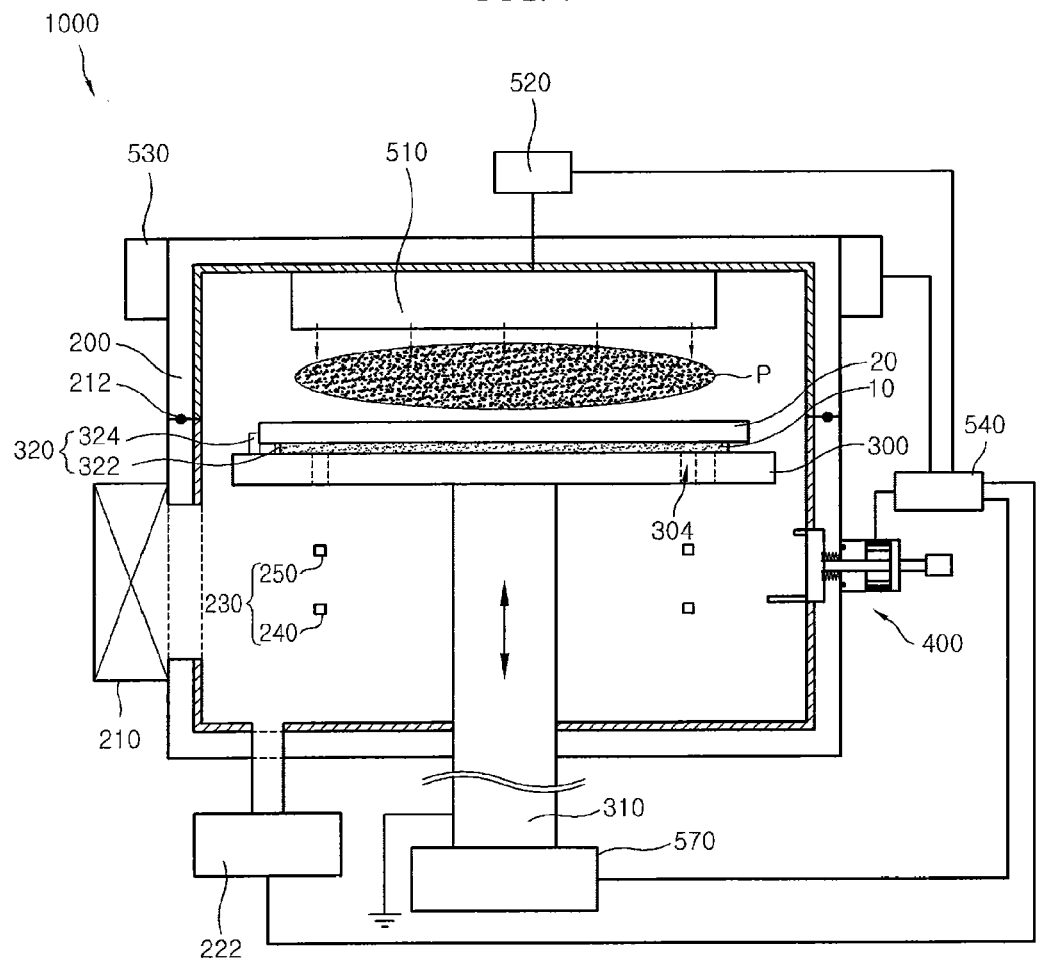
FIG. 7 is a view showing the inner structure of a substrate processing apparatus in accordance with an exemplary embodiment.

FIG. 7 shows the inner structure of a substrate processing apparatus according to an embodiment.

Referring to FIG. 7, the substrate processing apparatus 1000 includes the substrate alignment apparatus 100 and a fuel supply apparatus 500 adapted to supply fuel into the inner space of the chamber 200 of the substrate alignment apparatus 100. The substrate alignment apparatus 100 includes the chamber 200 having the inner space, the susceptor 300 driven in a vertical direction in the inner space of the chamber 200 to sequentially seat the substrate 10 and the mask 20 thereon, the position fixing unit 320 protruding from the upper surface of the susceptor 300 to form the reference lines for alignment of the substrate 10 and the mask 20, the horizontal transfer unit 400 connected at the outer surfaces of the not-opposing sidewalls of the chamber 200 and extended through into the inner surface so as to push the substrate 10 and the mask 20 in association with the up and down movement of the susceptor 300 until a horizontal transfer of the substrate 10 and the mask 20 is stopped by the position fixing unit 320.

The fuel supply device 500 which is adapted to generate plasma includes a shower head 510 disposed at an inner upper end of the chamber 200 to inject a reaction gas into the inner space, a high-frequency generation unit 530 surrounding the outer surface of the chamber 200 to generate and supply high frequency into the chamber 200, and a gas supply unit 520 disposed at the outside of the chamber 200 to supply the reaction gas to the shower head 510, and a power supply unit 540 adapted to supply power to the high-frequency generation unit 530.

In addition, the air discharge unit 222 is formed at the lower wall of the chamber 200 to discharge particles generated during processing of the reaction gas and the plasma. The air discharge unit 222 includes a pump. A susceptor driving unit 570 is mounted through the lower wall of the chamber 200 at a lower part of the susceptor shaft 310 which perpendicularly supports the susceptor 300 in order to drive the susceptor shaft 310 up and down.

The power supply unit 540 supplies power also to the susceptor driving unit 570 and the horizontal transfer unit 400.

The control unit collectively controls driving of the substrate alignment apparatus 100 and driving of the fuel supply apparatus 500.

According to the above described substrate alignment apparatus, the substrate processing apparatus including the same, and the substrate alignment method, an alignment margin is unnecessary when aligning the mask on the substrate. Also, the alignment may be achieved automatically and precisely without generating an alignment error. Furthermore, since expensive equipment such as an optical microscope and a camera is not necessary, the initial installation cost may be reduced. Additionally, easy repair and maintenance help reduce cost and time for the same. As a result, when manufacturing various devices through various vapor-deposition methods, productivity of the substrate, that is, productivity of a thin film may be greatly improved.

Although the present invention has been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. An apparatus for substrate alignment, comprising:
a chamber supplying an inner space;
a susceptor driven up and down in the inner space of the chamber; and
a horizontal transfer unit configured to align a substrate and a mask by being driven by a driving unit which horizontally moves in operational association with the up and down movement of the susceptor, wherein the horizontal transfer unit comprises (i) a substrate push pin pushing a lateral side of the substrate, (ii) a mask push pin pushing a lateral side of the mask, and (iii) a push pin fixing body having an upper part connected to the mask push pin and a lower part connected to the substrate push pin.

2. The apparatus for substrate alignment of claim 1, wherein the horizontal transfer unit is provided in a pair, each of which comprises:
a cylinder connected to outer surfaces of two not-opposing sidewalls of the chamber, comprising a piston which reciprocates in a horizontal direction through a sidewall of the chamber; and
a push pin unit connected to one end of the piston to push the lateral side of the substrate or the mask according to horizontal movement of the piston.

3. The apparatus for substrate alignment of claim 2, wherein the push pin unit comprises:
the substrate push pin pushing the lateral side of the substrate;
the mask push pin pushing the lateral side of the mask; and
the push pin fixing body connected to one end of the piston to fix the substrate push pin and the mask push pin in their horizontal positions so that the substrate push pin and the mask push pin are spaced apart from each other in a vertical direction, wherein a length of the mask push pin disposed above the substrate push pin is shorter than a length of the substrate push pin.

4. The apparatus for substrate alignment of claim 1, wherein the chamber comprises a plurality of holders to support lower surfaces of the substrate and the mask by protruding to the inner space of the chamber from two opposite inner sidewalls of the chamber in a direction intersecting with a direction in which the substrate and the mask are introduced to the inner space.

5. The apparatus for substrate alignment of claim 4, wherein the plurality of holders comprise:
a plurality of substrate holders configured to support both sides of the lower surface of the substrate; and
a plurality of mask holders separated in upward direction from the substrate holders to support both sides of the lower surface of the mask, wherein the substrate holders and the mask holders have a bar shape.

6. The apparatus for substrate alignment of claim 5, wherein the plurality of substrate holders and the plurality of mask holders are made of anodized aluminum (Al).

7. The apparatus for substrate alignment of claim 5, wherein upper surfaces of the plurality of substrate holders are inclined downward to the inner space of the chamber, the upper surface being in contact with the lower surface of the substrate.

8. The apparatus for substrate alignment of claim 5, wherein a ball bearing is coupled to protrude at one side of an upper surface of the mask holder, the ball bearing being in contact with the lower surface of the mask.

9. The apparatus for substrate alignment of claim 4, wherein the susceptor comprises:
a pair of horizontal transfer units passing holes and a plurality of holder passing holes formed on a circumference thereof to allow passage of the horizontal transfer units and the holders, respectively, while moving up and down; and
a plurality of stoppers arranged at intervals on an upper surface of the susceptor adjacent to the circumference and configured to prevent escape of the substrate and the mask.

10. An apparatus for substrate alignment, comprising:
a position fixing unit connected to protrude from an upper surface of a susceptor which is driven up and down in an inner space of a chamber so as to form a reference line for alignment of a substrate and a mask;
a horizontal transfer unit connected at outer surfaces of two not-opposing sidewalls of the chamber and extended through into the inner space and configured to align the substrate and the mask in association with the up and down movement of the susceptor until a horizontal transfer of the substrate and the mask are stopped by the position fixing unit, wherein the horizontal transfer unit comprises (i) a substrate push pin pushing a lateral side of the substrate, (ii) a mask push pin pushing a lateral side of the mask, and (iii) a push pin fixing body having an upper part connected to the mask push pin and a lower part connected to the substrate push pin; and
a control unit configured to control driving of the susceptor and the horizontal transfer unit.

11. The apparatus for substrate alignment of claim 10, wherein the position fixing unit comprises:
a first position fixing unit protruding from the upper surface of the susceptor to stop a horizontal transfer of the substrate; and
a second position fixing unit protruding from a position outer than the first position fixing unit on the upper surface of the susceptor to stop a horizontal transfer of the mask, wherein a protruding height of the first position fixing unit is equal to or less than a thickness of the substrate and a protruding height of the second position fixing unit is greater than the thickness of the substrate.

12. The apparatus for substrate alignment of claim 11, wherein the first position fixing unit and the second position fixing unit comprise any one of a plurality of position pins coupled to be spaced apart from each other and protruded from the upper surface of the susceptor along two adjoining circumferential sides of the susceptor, the two adjoining circumferential sides not being adjacent to the horizontal transfer units; and a plurality of position blocks coupled to protrude near a corner formed by the two adjoining circumferential sides of the susceptor, the two adjoining circumferential sides not being adjacent to the horizontal transfer units.

13. The apparatus for substrate alignment of claim 12, wherein the position block has an L-shape cross section for contact with a corner of the substrate or the mask.

14. The apparatus for substrate alignment of claim 10, wherein the horizontal transfer unit is provided in a pair, each of which comprises:
a cylinder connected to each of the outer surfaces of the two not-opposing sidewalls of the chamber, comprising a piston which reciprocates in a horizontal direction through the sidewall of the chamber; and
a push pin unit connected to one end of the piston to push a lateral side of the substrate or the mask according to the horizontal movement of the piston.

15. The apparatus for substrate alignment of claim 14, wherein the push pin unit comprises:
a substrate push pin pushing the lateral side of the substrate;
a mask push pin pushing the lateral side of the mask; and
a push pin fixing body connected to one end of the piston to fix the substrate push pin and the mask push pin in their horizontal positions so that the substrate push pin and the mask push pin are spaced apart from each other in a vertical direction, wherein a length of the mask push pin disposed above the substrate push pin is shorter than a length of the substrate push pin.

16. The apparatus for substrate alignment of claim 10, wherein the chamber comprises a plurality of holders to support lower surfaces of the substrate and the mask by protruding to the inner space of the chamber from two opposite inner sidewalls of the chamber in a direction intersecting with a direction in which the substrate and the mask are introduced to the inner space.

* * * * *